(12) United States Patent
Zeng et al.

(10) Patent No.: US 10,394,374 B2
(45) Date of Patent: Aug. 27, 2019

(54) TOUCH CONTROL DISPLAY PANEL AND TOUCH CONTROL DISPLAY DEVICE

(71) Applicant: Shanghai Tianma Micro-Electronics Co., Ltd., Shanghai (CN)

(72) Inventors: Yang Zeng, Shanghai (CN); Lingxiao Du, Shanghai (CN); Xingyao Zhou, Shanghai (CN); Lihua Wang, Shanghai (CN); Qijun Yao, Shanghai (CN); Kang Yang, Shanghai (CN); Hong Ding, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 172 days.

(21) Appl. No.: 15/791,056

(22) Filed: Oct. 23, 2017

(65) Prior Publication Data
US 2018/0059862 A1 Mar. 1, 2018

(30) Foreign Application Priority Data

Mar. 30, 2017 (CN) .......................... 2017 1 0204698

(51) Int. Cl.
*G06F 3/041* (2006.01)
*H01L 27/32* (2006.01)
(Continued)

(52) U.S. Cl.
CPC ............ *G06F 3/0416* (2013.01); *G06F 3/044* (2013.01); *G06F 3/0412* (2013.01); *H01L 27/323* (2013.01); *H01L 27/3276* (2013.01); *G06F 2203/04112* (2013.01); *G09G 2310/0264* (2013.01); *H01L 51/5246* (2013.01)

(58) Field of Classification Search
CPC ............................ G06F 3/0416; H01L 27/323
See application file for complete search history.

(56) References Cited

U.S. PATENT DOCUMENTS 6,307,528 B1 * 10/2001 Yap ...................... G09G 3/3258
313/504
2014/0159000 A1 * 6/2014 Kang ................... H01L 51/5253
257/40

(Continued)

FOREIGN PATENT DOCUMENTS

CN 102955625 A 3/2013

*Primary Examiner* — Matthew Yeung
(74) *Attorney, Agent, or Firm* — Anova Law Group, PLLC

(57) ABSTRACT

A touch control display panel and a touch control display device are provided. The touch control display panel comprises a substrate including a display region and a non-display region; an organic light-emitting structure; a thin film encapsulation layer having a first side facing the substrate; a first retaining wall; first and second touch control electrodes; first and second touch control lines disposed in the non-display region; and conductive leads disposed on the first side of the thin film encapsulation layer. At least one first touch control line steps across the first retaining wall to be electrically connected to a corresponding conductive lead, and further electrically connected to a driving chip or a flexible printed circuit disposed in a first non-display region through the corresponding conductive lead. A connection region of the at least one first touch control line and the corresponding conductive lead is arranged outside the first retaining wall.

20 Claims, 15 Drawing Sheets

(51) Int. Cl.
*G06F 3/044* (2006.01)
*H01L 51/52* (2006.01)

(56) References Cited

U.S. PATENT DOCUMENTS

| | | | | |
|---|---|---|---|---|
| 2015/0014653 A1* | 1/2015 | Lee | ................... | H01L 51/5253 257/40 |
| 2015/0228928 A1* | 8/2015 | Kim | ................... | H01L 51/5256 257/40 |
| 2015/0380685 A1* | 12/2015 | Lee | ................... | H01L 51/5243 257/40 |
| 2017/0069692 A1* | 3/2017 | Lee | ..................... | H01L 27/323 |

* cited by examiner

TOUCH CONTROL DISPLAY PANEL AND TOUCH CONTROL DISPLAY DEVICE

CROSS-REFERENCES TO RELATED APPLICATIONS

This application claims the priority of Chinese Patent Application No. CN201710204698.2, filed on Mar. 30, 2017, the entire contents of which are incorporated herein by reference.

FIELD OF THE DISCLOSURE

The present disclosure generally relates to the touch control technology and, more particularly, relates to a touch control display panel and a touch control display device thereof.

BACKGROUND

A touch control panel is an input device that detects the touch location of a user finger or a tool, and a touch control display panel is a device in which a touch control function and a display function are integrated. The touch control display panel often includes a touch control electrode layer for realizing the touch control function, and the touch control electrode layer includes a plurality of touch control electrodes. For each touch control electrode, a corresponding touch control line electrically connected to the touch control electrode is disposed in a non-display region of the touch control display panel.

Because the touch control display panel often includes a substantially large number of touch control electrodes, a substantially large number of the touch control lines may have to be disposed in the non-display region of the touch control display panel to be electrically connected to the touch control electrodes. Such a large number of touch control lines may occupy a substantially large area in the non-display region of the touch control display panel, which increases the area of the non-display region of the touch control display panel and, meanwhile, is not in line with the development trend of narrow borders of the touch control display panel.

The disclosed touch control display device and touch control display device thereof are directed to solve one or more problems set forth above and other problems.

BRIEF SUMMARY OF THE DISCLOSURE

One aspect of the present disclosure provides a touch control display panel. The touch control display panel comprises a substrate including a display region and a non-display region surrounding the display region, wherein the non-display region includes a first non-display region, a second non-display region arranged opposite to the first non-display region in a first direction, a third non-display region, and a fourth non-display region arranged opposite to the third non-display region in a second direction; an organic light-emitting structure disposed on the display region of the substrate; a thin film encapsulation layer having a first side facing the substrate and an opposite second side; a first retaining wall disposed on the non-display region of the substrate and surrounding the organic light-emitting structure; a plurality of first touch control electrodes extending in the second direction and a plurality of second touch control electrodes extending in the first direction; a plurality of first touch control lines and a plurality of second touch control lines disposed in the non-display region of the touch control display panel; and a plurality of conductive leads disposed on the first side of the thin film encapsulation layer. At least one first touch control line steps across the first retaining wall to be electrically connected to a corresponding conductive lead, and further electrically connected to a driving chip or a flexible printed circuit (FPC) disposed in the first non-display region through the corresponding conductive lead. A connection region where the at least one first touch control line is electrically connected to the corresponding conductive lead is arranged outside the first retaining wall.

Another aspect of the present disclosure provides a touch control display device comprising a touch control display panel. The touch control display panel comprises a substrate including a display region and a non-display region surrounding the display region, wherein the non-display region includes a first non-display region, a second non-display region arranged opposite to the first non-display region in a first direction, a third non-display region, and a fourth non-display region arranged opposite to the third non-display region in a second direction; an organic light-emitting structure disposed on the display region of the substrate; a thin film encapsulation layer having a first side facing the substrate and an opposite second side; a first retaining wall disposed on the non-display region of the substrate and surrounding the organic light-emitting structure; a plurality of first touch control electrodes extending in the second direction and a plurality of second touch control electrodes extending in the first direction; a plurality of first touch control lines and a plurality of second touch control lines disposed in the non-display region of the touch control display panel; and a plurality of conductive leads disposed on the first side of the thin film encapsulation layer. At least one first touch control line steps across the first retaining wall to be electrically connected to a corresponding conductive lead, and further electrically connected to a driving chip or a flexible printed circuit (FPC) disposed in the first non-display region through the corresponding conductive lead. A connection region where the at least one first touch control line is electrically connected to the corresponding conductive lead is arranged outside the first retaining wall.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
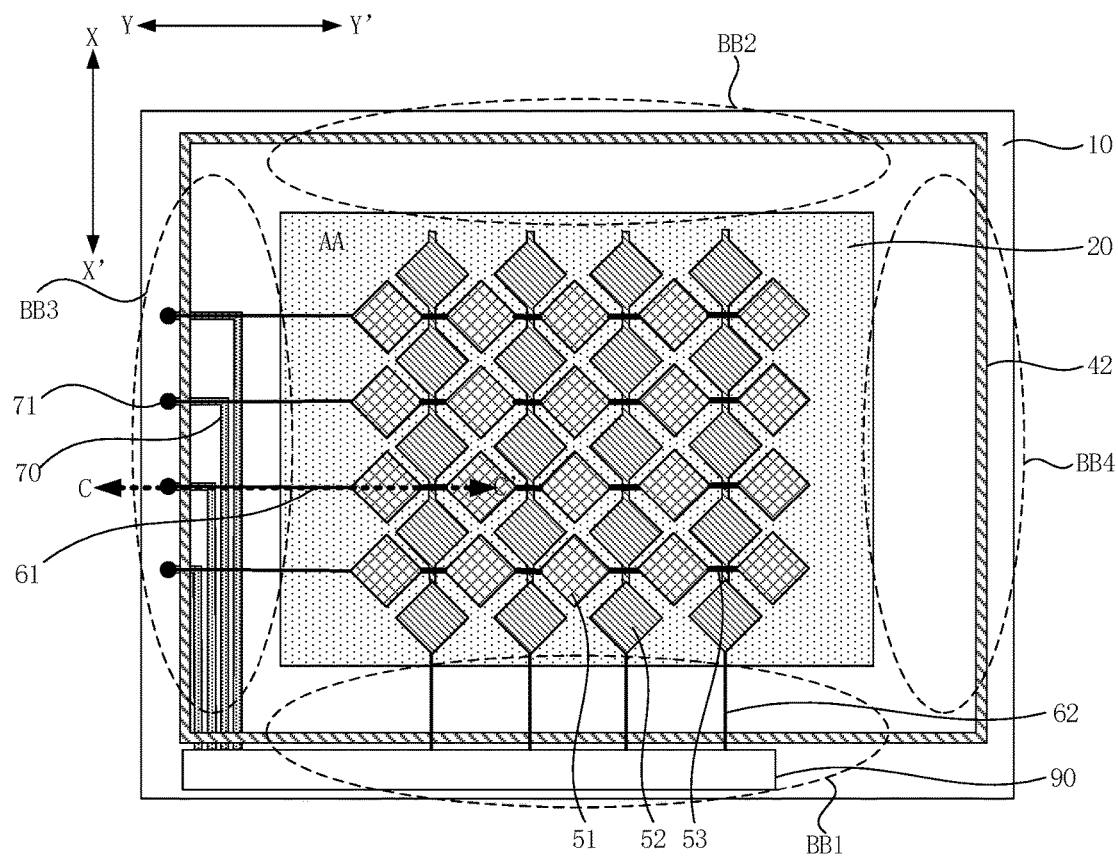
FIG. 1 illustrates a schematic top view of an exemplary touch control display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improved touch control display panel and touch control display device thereof, which may be able to reduce the area occupied by the touch control lines in the non-display region of the touch control display and achieve narrow borders of the touch control display panel.

The touch control display panel comprises:

a substrate including a display region and a non-display region surrounding the display region, wherein the non-display region includes a first non-display region, a second non-display region arranged opposite to the first non-display region in a first direction, a third non-display region, and a fourth non-display region arranged opposite to the third non-display region in a second direction;

an organic light-emitting structure disposed on the display region of the substrate;

a thin film encapsulation layer configured to cover the organic light-emitting structure, wherein the thin film encapsulation layer has a first side facing the substrate and an opposite second side;

a first retaining wall disposed on the non-display region of the substrate and surrounding the organic light-emitting structure;

a plurality of first touch control electrodes extending in the second direction and a plurality of second touch control electrodes extending in the first direction, wherein the plurality of first touch control electrodes are intersecting but electrically insulated from the plurality of second touch control electrodes;

a plurality of first touch control lines and a plurality of second touch control lines disposed in the non-display region of the touch control display panel, wherein each first touch control electrode is electrically connected to a corresponding first touch control line, and each second touch control electrode is electrically connected to a corresponding second touch control line; and a plurality of conductive leads disposed on the first side of the thin film encapsulation layer, wherein at least one first touch control line steps across the first retaining wall to be electrically connected to a corresponding conductive lead, and further electrically connected to a driving chip or a flexible printed circuit (FPC) disposed in the first non-display region through the corresponding conductive lead, and a connection region where the at least one first touch control line is electrically connected to the corresponding conductive lead is arranged outside the first retaining wall.

As discussed in the background, because the touch control display panel often includes a substantially large number of touch control electrodes, a substantially large number of the touch control lines may have to be disposed in the non-display region of the touch control display panel to be electrically connected to the touch control electrodes. Such a large number of touch control lines may occupy a substantially large area in the non-display region of the touch control display panel, which increases the area of the non-display region of the touch control display panel and, meanwhile, is not in line with the development trend of narrow borders of the touch control display panel.

To solve one or more problems set forth above and other problems, in the disclosed embodiments, the organic light-emitting structure may be disposed on the display region of the substrate, and the thin film encapsulation layer may cover the organic light-emitting structure. The first retaining wall may be disposed on the non-display region of the substrate and surrounding the organic light-emitting structure.

The plurality of first touch control electrodes may be intersecting but electrically insulated from the plurality of second touch electrodes. The plurality of first touch control electrodes may extend in a different direction from the plurality of second touch electrodes. Each first touch control electrode may be electrically connected to a corresponding first touch control line, and each second touch control electrode may be electrically connected to a corresponding second touch control line.

The thin film encapsulation layer may have a first side facing the substrate and an opposite second side. In particular, through disposing a plurality of conductive leads on the first side of the thin film encapsulation layer, at least one first touch control line may step across the first retaining wall to be electrically connected to the corresponding conductive lead 70, and further electrically connected to driving chip or a flexible printed circuit (FPC) disposed in the first non-display region through the corresponding conductive lead.

As a comparison, in an existing touch control display panel, each of the plurality of first touch control line is directly electrically connected the driving chip or FPC disposed in the first non-display region. However, in the disclosed touch control panel, at least one of the plurality of first touch control lines may be electrically connected to the driving chip or FPC disposed in the first non-display region through the corresponding conductive lead. Further, by configuring the position of the conductive lead through which the first touch control line is electrically connected to the driving chip or FPC in the first non-display region, the area occupied by the touch control lines in the non-display region of the touch control display may be reduced, thereby facilitating the narrow borders of the touch control display panel.

Meanwhile, when the first touch control line has to be electrically connected to the corresponding conductive lead via a through-hole, because the retaining wall effectively confines the edge of the thin film encapsulation layer, through configuring the connection region where the first touch control line is electrically connected to the corresponding conductive lead to be outside the first retaining wall, the connection region may be no longer located in the thin film encapsulation layer.

That is, a through-hole may not have to be disposed in the thin film encapsulation layer for realizing the electrical connection between the first touch control line and the corresponding conductive lead. Accordingly, the oxygen and moisture barrier properties of the thin film encapsulation layer may not be degraded by the holes in the thin film encapsulation layer, and the various elements inside the touch control panel display may not be affected by the oxygen and moisture from the external environment.

In the disclosed embodiments, the touch control display panel may include any appropriate type of touch control display panels capable of displaying videos and/or images, such as plasma touch control display panels, field emission touch control display panels, organic light-emitting diode (OLED) touch control display panels, light-emitting diode (LED) touch control display panels, liquid crystal touch control display panels, quantum dots (QDs) touch control display panels, electrophoretic touch control display panels, etc.

In one embodiment, the touch control display panel may be an OLED touch control display panel.

Figure 2:
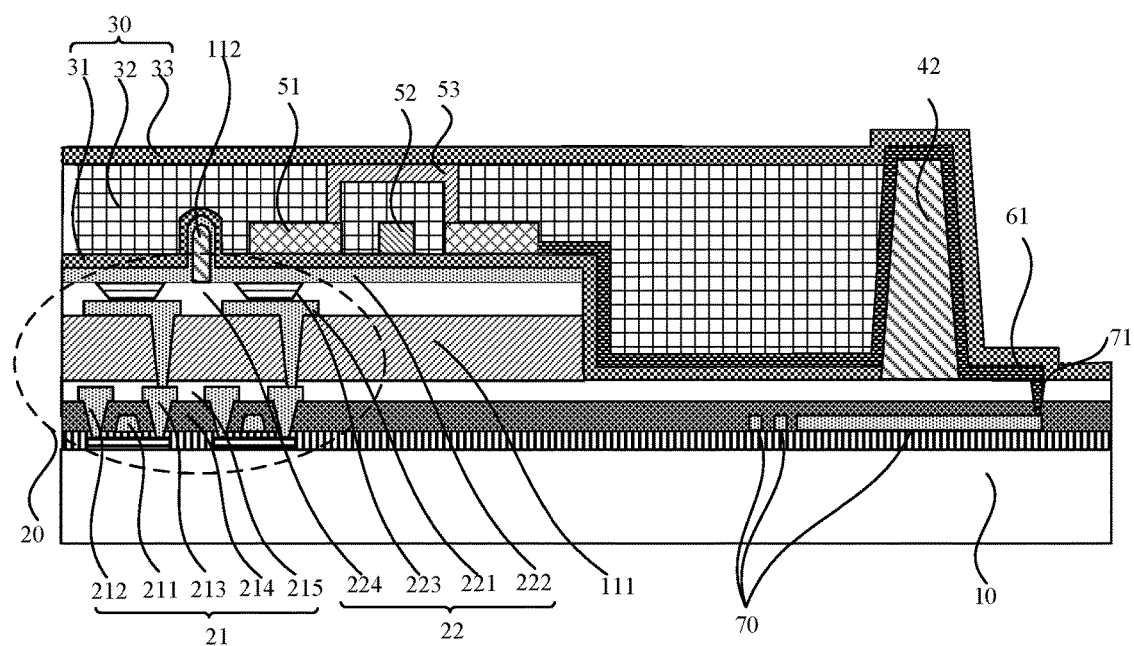
FIG. 2 illustrates a CC'-sectional view of an exemplary touch control display panel in FIG. 1 consistent with disclosed embodiments.

FIG. 1 illustrates a schematic top view of an exemplary touch control display panel consistent with disclosed embodiments. FIG. 2 illustrates a CC'-sectional view of an exemplary touch control display panel in FIG. 1 consistent with disclosed embodiments.

As shown in FIGS. 1-2, the touch control display panel may comprise a substrate 10, an organic light-emitting structure 20, a thin film encapsulation layer 30, a first retaining wall 42, a plurality of first touch control electrodes 51, a plurality of second touch control electrodes 52, a plurality of first touch control lines 61, a plurality of second touch control lines 62, and a plurality of conductive leads 70.

The substrate 10 may include a display region AA and a non-display region surrounding the display region AA, and the non-display region may include a first non-display region BB1, a second non-display region BB2, a third non-display region BB3, and a fourth non-display region BB4. The first non-display region BB1 and the second non-display region BB2 may be arranged opposite to each other in a first direction XX', and the third non-display region BB3 and the fourth non-display region BB4 may be arranged opposite to each other in a second direction YY'.

The organic light-emitting structure 20 may be disposed on the display region AA of the substrate 10. The thin film encapsulation layer 30 may cover the organic light-emitting structure 20 to encapsulate the organic light-emitting structure 20 from an upper side. The first retaining wall 42 may be disposed on the non-display region of the substrate 10 and surrounding the organic light-emitting structure 20. The plurality of first touch control electrodes 51 may intersect or cross the plurality of second touch control electrodes 52. The first touch control electrodes 51 may extend in the second direction YY', and the second touch control electrodes 52 may extend in the first direction XX'.

The first touch control lines 61 and the second touch control lines 62 may be disposed in the non-display region of the touch control display panel. Each first touch control electrode 51 may be electrically connected to a corresponding first touch control line 61, and each second touch control electrode 52 may be electrically connected to a corresponding second touch control line 62. The thin film encapsulation layer 30 may have a first side facing the substrate 10 and an opposite second side, and the plurality of conductive leads 70 may be disposed on the first side of the thin film encapsulation layer 30.

Figure 3:
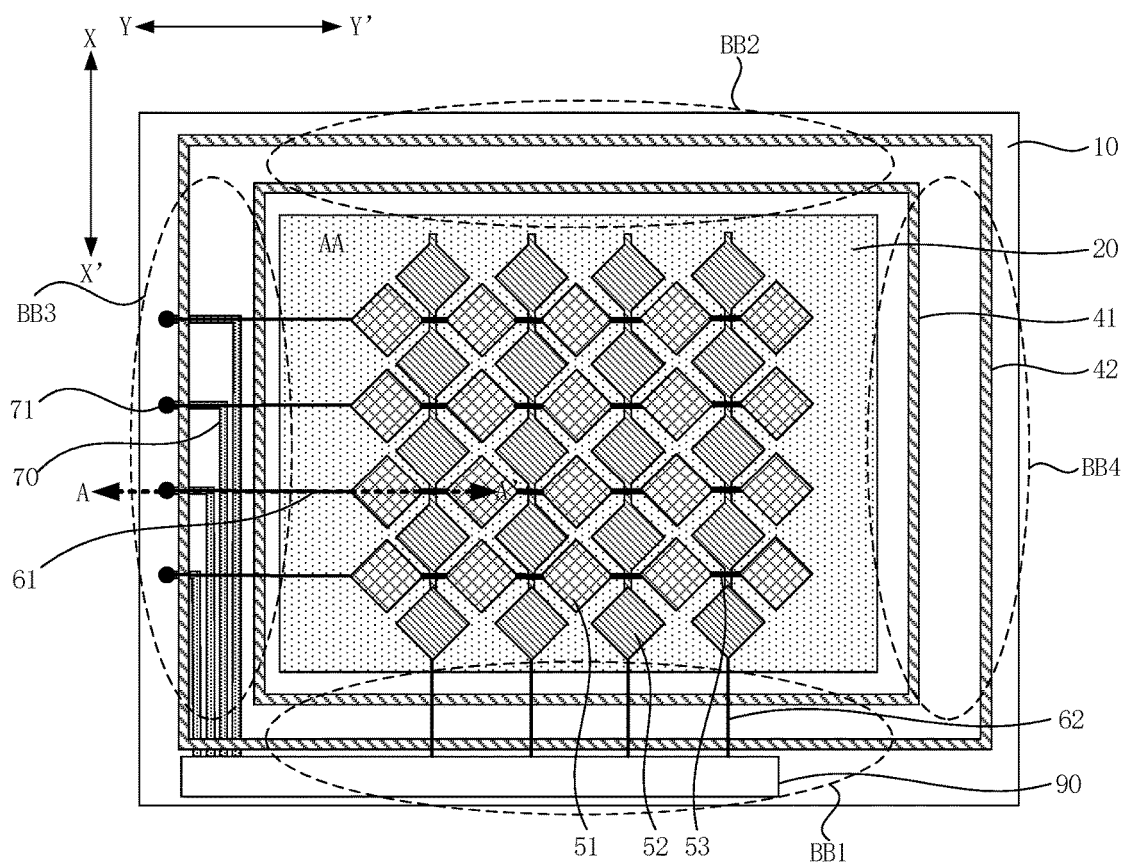
FIG. 3 illustrates a schematic top view of another exemplary touch control display panel consistent with disclosed embodiments.

In particular, at least one first touch control line 61 may cross the first retaining wall 42 to be electrically connected to the corresponding conductive lead 70, and further electrically connected to a driving chip or a flexible printed circuit (FPC) disposed in the first non-display region BB1 through the corresponding conductive lead 70. As shown in FIG. 3, the element 90 may be a driving chip or a flexible printed circuit (FPC).

Returning to FIG. 1 and FIG. 2, the first touch control line 61 may be electrically connected to the corresponding conductive lead 70 at a location or a connection region 71 outside the first retaining wall 42. That is, the connection region 71 where the first touch control line 61 is electrically connected to the corresponding conductive lead 70 may be arranged outside the first retaining wall 42. Because the first retaining wall 42 is disposed on the non-display region of the substrate 10, the connection region 71 where the first touch control line 61 is electrically connected to the corresponding conductive lead 70 may also be arranged on the non-display region of the substrate 10.

In another embodiment, the touch control display panel may further include a second retaining wall disposed on the non-display region of the substrate 10 and surrounding the organic light-emitting structure 20. In particular, the first retaining wall 42 may be disposed in the non-display region of the substrate 10 and surrounding the second retaining wall 41. A corresponding structure in shown in FIGS. 3-4.

Figure 4:
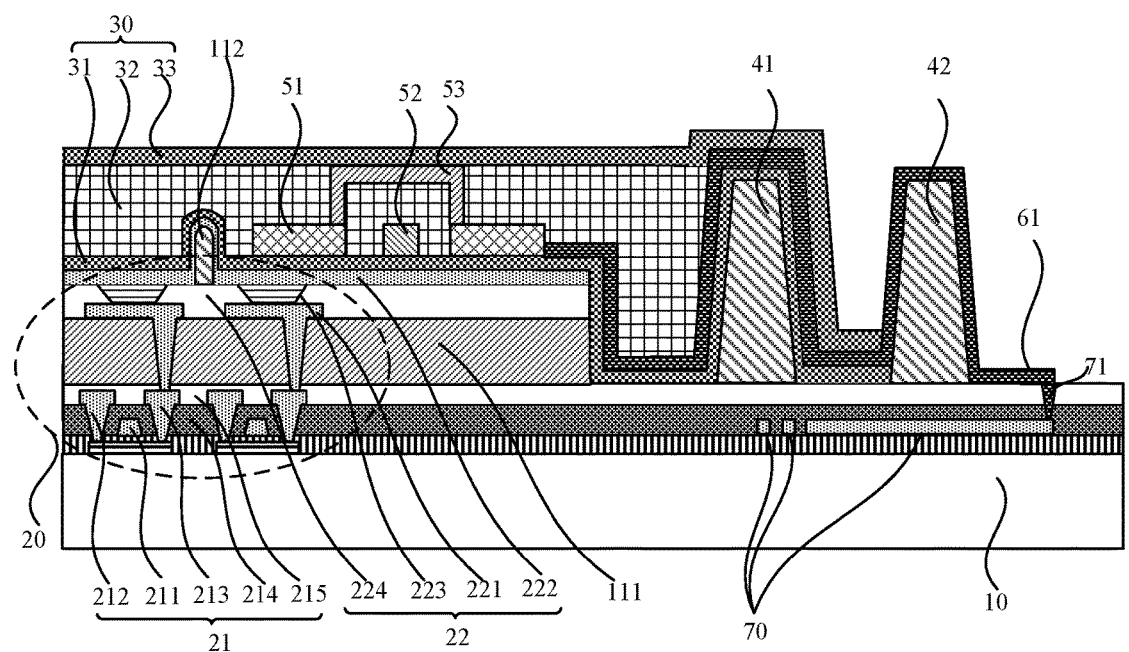
FIG. 4 illustrates an AA'-sectional view of another exemplary touch control display panel in FIG. 3 consistent with disclosed embodiments.

FIG. 3 illustrates a schematic top view of another exemplary touch control display panel consistent with disclosed embodiments. FIG. 4 illustrates an AA'-sectional view of another exemplary touch control display panel in FIG. 3 consistent with disclosed embodiments. The similarities between FIGS. 3-4 and FIGS. 1-2 are not repeated here, while certain difference may be explained.

As shown in FIGS. 3-4, the touch control display panel may include a substrate 10, an organic light-emitting structure 20, a thin film encapsulation layer 30, a second retaining wall 41, a first retaining wall 42, a plurality of first touch control electrodes 51, a plurality of second touch control electrodes 52, a plurality of first touch control lines 61, a plurality of second touch control lines 62, and a plurality of conductive leads 70.

The organic light-emitting structure 20 may be disposed on the display region AA of the substrate 10. The thin film encapsulation layer 30 may cover the organic light-emitting structure 20. The second retaining wall 41 may be disposed on the non-display region of the substrate 10 and surrounding the organic light-emitting structure 20. The first retaining wall 42 may be disposed on the non-display region of the substrate 10 and surrounding the second retaining wall 41. The plurality of first touch control electrodes 51 may intersect or cross the plurality of second touch control electrodes 52. The first touch control electrodes 51 may extend in the second direction YY', and the second touch control electrodes 52 may extend in the first direction XX'.

The first touch lines 61 and the second touch control lines 62 may be disposed in the non-display region of the touch control display panel. Each first touch control electrode 51 may be electrically connected to a corresponding first touch control line 61, and each second touch control electrode 52 may be electrically connected to a corresponding second touch control line 62. The thin film encapsulation layer 30 may have a first side facing the substrate 10 and an opposite second side, and the plurality of conductive leads 70 may be disposed on the first side of the thin film encapsulation layer 30.

In particular, at least one first touch control line 61 may be electrically connected to the corresponding conductive lead 70 by stepping across both the first retaining wall 42 and the second retaining wall 41, and further electrically connected to a driving chip or a flexible printed circuit (FPC) disposed in the first non-display region BB1 through the corresponding conductive lead 70. As shown in FIG. 3, the element 90 may be a driving chip or a flexible printed circuit (FPC), and the first touch control line 61 may be electrically connected to the corresponding conductive lead 70 at a connection region 71 outside the first retaining wall 42. That is, the connection region 71 where the first touch control line 61 is electrically connected to the corresponding conductive lead 70 may be arranged outside the first retaining wall 42.

As shown in FIG. 3, the plurality of conductive leads 70 may be disposed between the second retaining wall 41 and the first retaining wall 42, and the connection region 71 where the first touch control line 61 is electrically connected to the corresponding conductive lead 70 may be in the third non-display region BB3, or in the fourth non-display region BB4, or in both the third non-display region BB3 and the fourth non-display region BB4, which is not limited by the present disclosure.

In one embodiment, as shown in FIG. 3, the connection region 71 where the first touch control line 61 is electrically connected to the corresponding conductive lead 70 may be arranged in the third non-display region BB3 and, meanwhile, outside the first retaining wall 42. Thus, any through-holes for realizing the electrical connection between the first touch control line 61 and the corresponding conductive lead 70 may not have to be disposed in the thin film encapsulation layer 30. Accordingly, the oxygen and moisture barrier properties of the thin film encapsulation layer 30 may not be degraded by the through-holes in the thin film encapsulation layer 30.

In one embodiment, as shown in FIG. 4, the organic light-emitting structure 20 may include a plurality of pixel driving circuits 21 and a plurality of organic light-emitting units 22 electrically connected to the corresponding pixel driving circuits 21. The organic light-emitting unit 22 may include a first electrode 221 and a second electrode 223. The pixel driving circuits 21 may include a plurality of thin film transistors (TFTs) and capacitors. Each TFT may include a gate metal layer and a source-drain metal layer, a first insulating layer 214, and a second insulating layer 215. The gate metal layer may include a gate electrode 211, and the source-drain metal layer may include a source electrode 212 and a drain electrode 213. The gate electrode 211 may be electrically insulated from the drain electrode 213 and the source electrode 212 through the first insulating layer 214. The first electrode 221 of the organic light-emitting unit 22 may be electrically insulated from the drain electrode 213 and the source electrode 212 through the second insulating layer 215.

The touch control display panel may further include a planarization layer 111 disposed between the pixel driving circuits 21 and the organic light-emitting units 22, a pixel defining layer 224 disposed between any adjacent organic light-emitting units 22, a spacer 112 disposed on the pixel defining layer 224.

Further, the conductive lead 70 may be disposed in the same layer as any one of the metal layers in the pixel driving circuit 21 or disposed in the same layer as the reflective electrode of the organic light-emitting unit 22.

In one embodiment, the conductive lead 70 may be disposed in the same layer as the gate metal layer or the source-drain metal layer in the TFT of the pixel driving circuit 21. In another embodiment, the conductive lead 70 may be disposed in the same layer as any one of the metal electrodes of the capacitors of the pixel driving circuit 21. In another embodiment, the conductive lead 70 may be disposed in the same layer as the first electrode 221 or the second electrode 222 in the organic light-emitting unit 22.

In one embodiment, as shown in FIG. 4, the conductive lead 70 may be disposed in the same layer as the gate electrode 211 in the TFT of the pixel driving circuit 21. The conductive lead 70 may be electrically connected to the first touch control line 61 via a though-hole disposed in the first insulating layer 214 and the second insulating layer 215.

Figure 5:
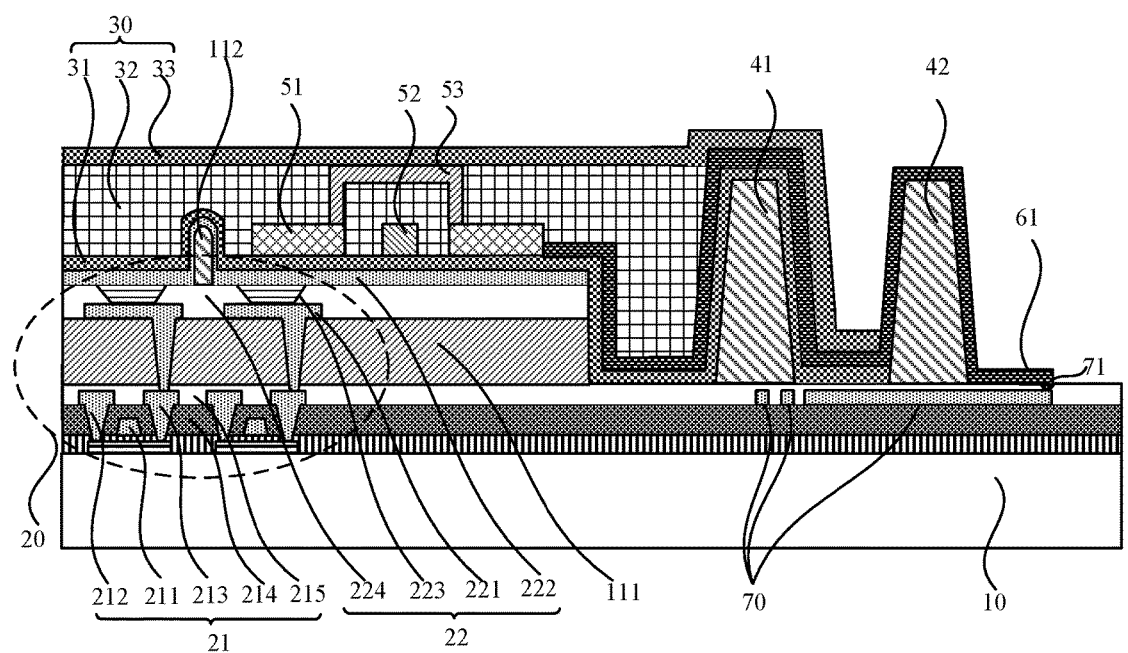
FIG. 5 illustrates a schematic cross-sectional view of another exemplary touch control display panel consistent with disclosed embodiments.

In another embodiment, as shown in FIG. 5, the conductive lead 70 may be disposed in the same layer as the source electrode 212 and the drain electrode 213 in the TFT of the pixel driving circuit 21. The conductive lead 70 may be electrically connected to the first touch control line 61 via a though-hole disposed the second insulating layer 215.

In another embodiment, the conductive lead 70 may be disposed in the same layer as the reflective electrode of the organic light-emitting unit 22. The touch control display panel may be, for example, a top emission type or a bottom emission type. A corresponding structure is shown in FIG. 6.

Figure 6:
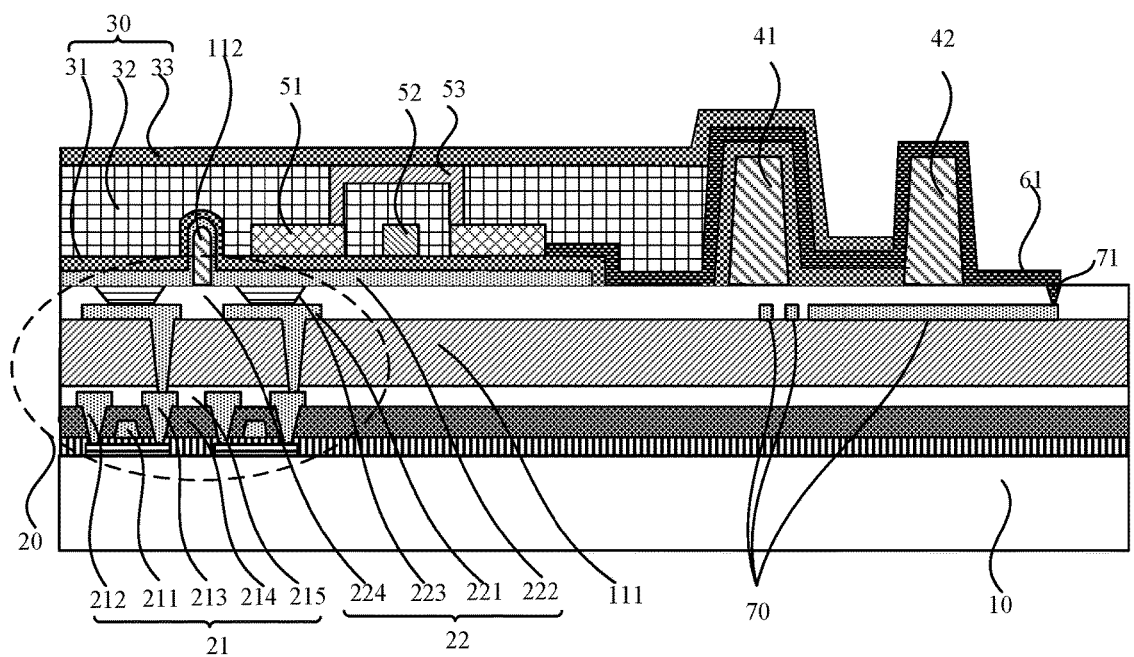
FIG. 6 illustrates a schematic cross-sectional view of another exemplary touch control display panel consistent with disclosed embodiments.

FIG. 6 illustrates a schematic cross-sectional view of another exemplary touch control display panel consistent with disclosed embodiments. As shown in FIG. 6, the touch control display panel may be a top emission type. The first electrode 221 in the organic light-emitting unit 22 may be electrically connected to the drain electrode 213 of the TFT in the pixel driving circuit 21, and the first electrode 221 may be configured as the reflective electrode, and the conductive lead 70 may be disposed in the same layer as the reflective electrode 221 of the organic light-emitting unit 22. The conductive lead 70 may be electrically connected to the first touch control line 61 via through-hole disposed in the pixel defining layer 224.

Through disposing the conductive lead 70 in the same layer as any one of the metal layers in the pixel driving circuit 21 or in the same layer as the reflective electrode of the organic light-emitting unit 22, the manufacturing process of the touch control display panel may be simplified.

In another embodiment, the conductive lead 70 electrically connected to the first touch control line 61 may be fabricated by introducing an extra metal layer to the touch control display panel. When the conductive lead 70 electrically connected to the first touch control line 61 is fabricated by introducing an extra metal layer to the touch control display panel, if the conductive lead 70 is disposed substantially close to the first touch control line 61, a substantially large coupling effect may be generated between the conductive lead 70 and the first touch control line 61. To suppress the coupling effect, the conductive lead 70 may be desired to be disposed far away from the first touch control line 61. A corresponding structure is shown in FIG. 7.

Figure 7:
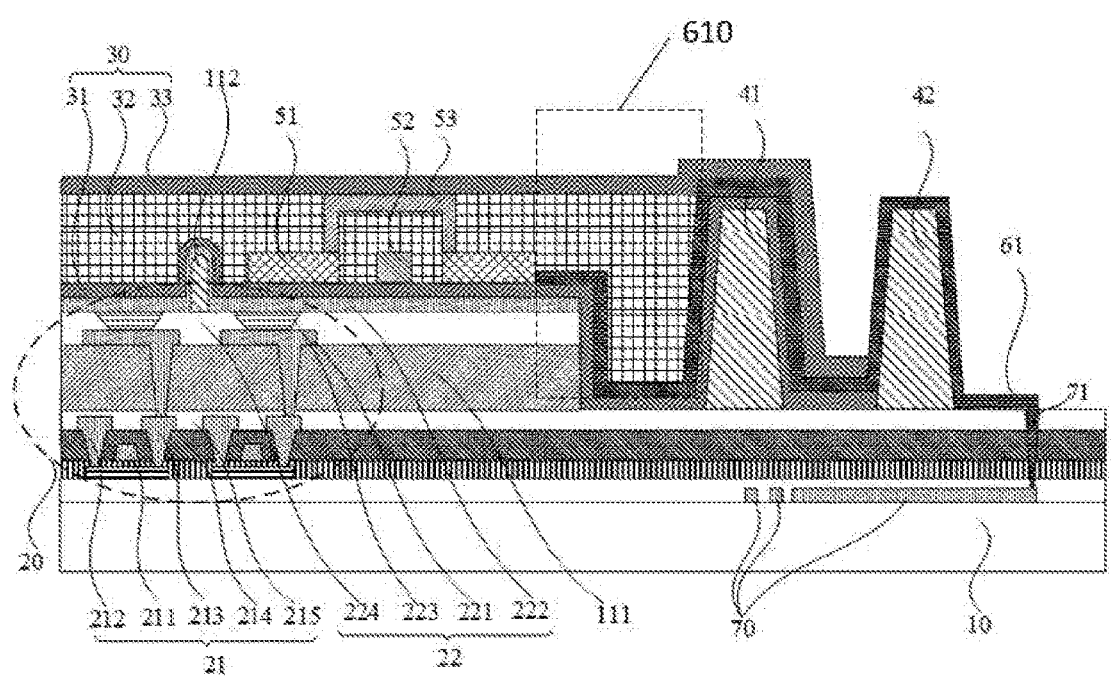
FIG. 7 illustrates a schematic cross-sectional view of another exemplary touch control display panel consistent with disclosed embodiments.

FIG. 7 illustrates a schematic cross-sectional view of another exemplary touch control display panel consistent with disclosed embodiments. As shown in FIG. 7, the conductive lead 70 may be disposed to be in direct contact with the substrate 10, such that the distance between the conductive lead 70 and the first touch control line 61 may be maximized, and the coupling effect between the conductive lead 70 and the first touch control line 61 may be minimized accordingly.

The thin film encapsulating layer 30 may comprise at least one inorganic barrier layer and at least one organic barrier layer stacked together. When the thin film encapsulating layer 30 comprises a plurality of inorganic barrier layers and a plurality of organic barrier layers, the inorganic barrier layers and the organic barrier layers may be alternately arranged.

The inorganic barrier layer in the thin film encapsulation layer 30 may have substantially good moisture and oxygen barrier properties, while the organic barrier layer sandwiched between two inorganic barrier layers may effectively release the stress between the two adjacent inorganic barrier layers. Meanwhile, through alternately arranging the inorganic barrier layers and the organic barrier layers in the thin film encapsulating layer 30, the organic barrier layer may separate two inorganic barrier layers from each other, thereby increasing the penetration length for the external moisture and oxygen to enter the organic light-emitting structure 20.

In one embodiment, as shown in FIG. 7, the thin film encapsulation layer 30 may include a first inorganic barrier layer 31, a first organic barrier layer 32, and a second inorganic barrier layer 33 sequentially disposed on the organic light-emitting structure 20.

At least the outermost inorganic barrier layer may cover the second retaining wall 41, the organic barrier layer may not cover the second retaining wall 41, and the inorganic barrier layer may cover or may not cover the first retaining wall 42.

For example, as shown in FIGS. 4-7, the first inorganic barrier layer 31 and the second inorganic barrier layer 33 (33 is the outermost inorganic barrier layer) may cover the second retaining wall 41, but the first organic barrier layer 32 may not cover the second retaining wall 41. The first inorganic barrier layer 31 and the second inorganic barrier layer 33 may not cover the first retaining wall 42. The second retaining wall 41 may be able to prevent the first organic barrier layer 32 from extending towards the non-display region of the touch control display panel, thereby facilitating the narrow border design of the touch control display panel.

Meanwhile, the first retaining wall 42 may be able to prevent the first inorganic barrier layer 31 and the second inorganic barrier layers 33 from continuously extending towards outside, such that when cutting the touch control display panel (e.g., cutting a mother panel into a plurality of child panels), the cutting position may not be located on the inorganic barrier layers. When the cutting position is located on the inorganic barrier layers, cracks may appear in the inorganic barrier layers and may even extend to the inside of the touch control display panel, degrading the performance of the touch control display panel. Through preventing the first inorganic barrier layer 31 and the second inorganic barrier layers 33 from continuously extending towards outside by the first retaining wall 42, the cutting position may be on longer located on the inorganic barrier layers. Accordingly, cracks in the inorganic barrier layers may be suppressed, and the performance of the touch control display panel may not be degraded.

As shown in FIGS. 2-7, the plurality of first control touch control electrodes 51 and the plurality of second touch control electrodes 52 may be disposed inside the thin film encapsulation layer 30. For the first touch control line 61 electrically connected to the conductive lead 70, a portion of the first touch control line 61 (for example, a portion 610 of the first touch control line 61 shown in FIG. 7) may be disposed inside the thin film encapsulation layer 30. The first touch control line 61 may be electrically connected to the corresponding conductive lead 70 by stepping across both the first retaining wall 42 and the second retaining wall 41. For example, in the region where the second retaining wall 41 is disposed, the first touch control line 61 electrically connected to the corresponding conductive lead 70 may be disposed between the first inorganic barrier layer 31 and the second inorganic barrier layer 33 of the thin film encapsulation layer 30.

Through configuring the position of conductive leads 70 in the touch control display panel, the area occupied by the first touch control lines 61 in the non-display region of the touch control display panel may be reduced, and narrow borders of the touch control display panel may be realized.

In another embodiment, the thin film encapsulation layer 30 may have a first side facing the substrate 10 and an opposite second side, and a plurality of first touch control electrodes 51 and second touch control electrodes 52 may be disposed on the second side of the thin film encapsulation layer 30. A corresponding structure is shown in FIG. 8.

Figure 8:
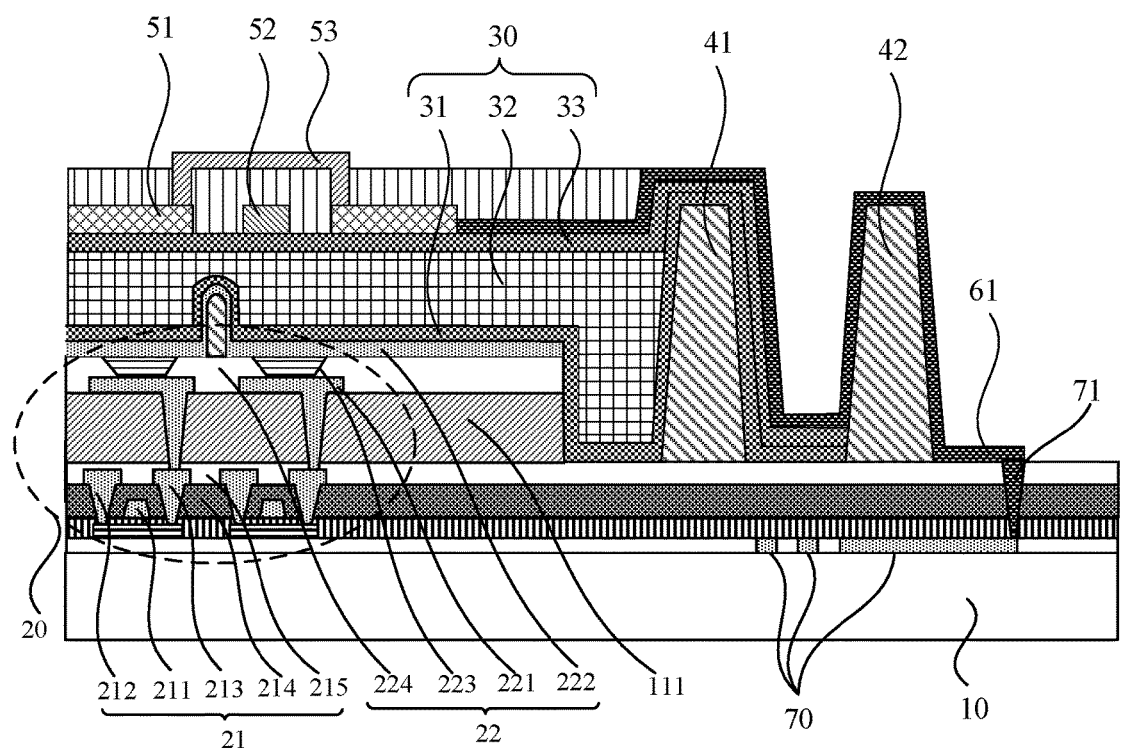
FIG. 8 illustrates a schematic cross-sectional view of another exemplary touch control display panel consistent with disclosed embodiments.

FIG. 8 illustrates a schematic cross-sectional view of another exemplary touch control display panel consistent with disclosed embodiments. The similarities between FIG. 8 and FIG. 7 are not repeated here, while certain difference may be explained.

As shown in FIG. 8, for the first touch control line 61 electrically connected to the conductive lead 70, a portion of the first touch control line 61 may be disposed on the second side of the thin film encapsulation layer 30, and the first touch control line 61 may be electrically connected to the corresponding conductive lead 70 by stepping across both the first retaining wall 42 and the second retaining wall 41. For example, the second inorganic layer 33 may have a first side facing the substrate 10 and an opposite second side. In the region where the second retaining wall 41 is disposed, the first touch control line 61 electrically connected to the corresponding conductive lead 70 may be disposed on the second side of the thin film encapsulation layer 30.

Similarly, through configuring the position of conductive leads 70 in the touch control display panel, the area occupied by the first touch control lines 61 in the non-display region of the touch control display panel may be reduced, and narrow borders of the touch control display panel may be realized.

In the disclosed embodiments, the thin film encapsulation layer 30 may have a first side facing the substrate 10 and an opposite second side. The first touch control electrodes 51 and second touch control electrodes 52 may be disposed inside the thin film encapsulation layer 30, or disposed on the second side of the thin film encapsulation layer 30. When the touch control electrodes are integrated with the display panel, to reduce the thickness of the touch control display panel, the first touch control lines electrically connected to the first touch control electrodes 51 may have to occupy the border of the display panel. For example, the first touch control lines electrically connected to the first touch control electrodes 51 may have to be disposed inside the second retaining wall and in the non-display region near the display region, or disposed in a region between the first retaining wall and the second retaining wall, or disposed in a region outside the first retaining wall and far away from the display region, all of which may increase the border of the touch control display panel.

When the first touch control lines electrically connected to the first touch control electrodes 51 are disposed in any one of the above-mentioned positions (i.e., inside the second retaining wall and in the non-display region near the display region, or in a region between the first retaining wall and the second retaining wall, or in a region outside the first retaining wall and far away from the display region), to reduce the border of the touch control display panel, the line width of the first touch control line may have to be reduced, or the gap between adjacent first touch control lines may have to be reduced, which may raise a high demand for the existing fabrication process.

In the disclosed embodiments, at least one first touch control line or all the first touch control lines may be electrically connected to the corresponding conductive leads across the first and second retaining walls, thereby reducing the area of the border occupied by the first touch control electrodes. Further, the connection regions of the first touch control lines and the conductive leads may be arranged outside the first retaining wall, such that the encapsulation performance of the thin film encapsulation layer may not be degraded. That is, the moisture and oxygen barrier properties of the thin film encapsulation layer may substantially remain the same, while the width of the area of the touch control display panel may be reduced.

Figure 9:
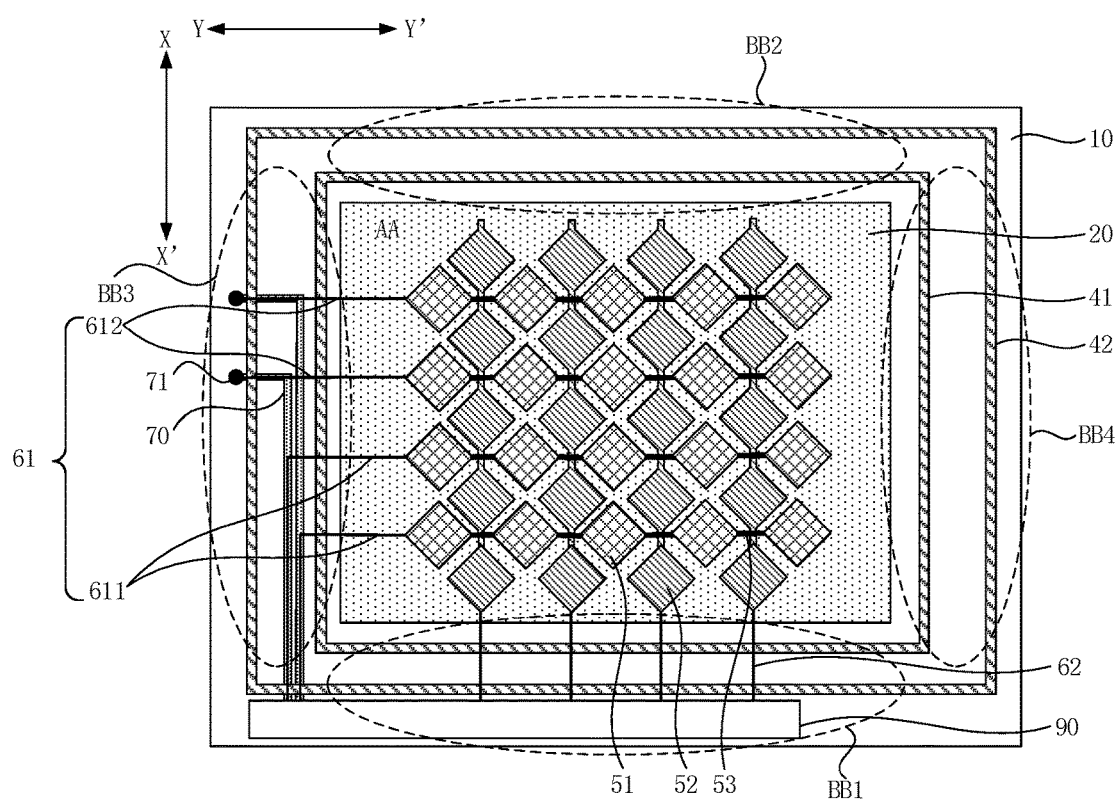
FIG. 9 illustrates a schematic top view of another exemplary touch control display panel consistent with disclosed embodiments.

FIG. 9 illustrates a schematic top view of another exemplary touch control display panel consistent with disclosed embodiments. The similarities between FIG. 9 and FIG. 3 are not repeated here, while certain difference may be explained.

FIG. 9 illustrates a plurality of first touch control lines 61. For example, first touch control lines 611 may be directly electrically connected to an element 90 (e.g., a driving chip or a FPC) located in the first non-display region BB1. Certain first touch control lines 61, such as first touch control lines 612, may be electrically connected to the corresponding conductive leads 70 through stepping across the second retaining wall 41 and the first retaining wall 42, and further electrically connected to a driving chip or a FPC located in the first non-display region BB1 through the corresponding conductive leads 70. Certain other first touch control lines 61, such as first touch control lines 611, may be directly electrically connected to a driving chip or a FPC located in the first non-display region BB1.

As shown in FIGS. 4-8, the conductive leads 70 electrically connected to the first touch control lines 61 may be disposed in the same layer as the reflective electrodes of the organic light-emitting unit 22, or disposed in the same layer as any one of the metal layers in the pixel driving circuit 21, or disposed in an extra metal layer introduced to the touch control display panel, in all of which the first touch control lines 61 and the conductive leads 70 are disposed at different layers. In FIGS. 4-8, all the first touch control lines 61 may be routed through the corresponding conductive leads 70.

As a comparison, as shown in FIG. 9, certain first touch control lines 61, such as first touch control lines 612, may be routed in a region between the first retaining wall 42 and second retaining wall 41, while certain other first touch control lines 61, such as first touch control lines 611, may be routed through the conductive leads 70 disposed at a different layer from the first touch control lines 61. Given the same line width of the first touch control line 61 and the same gap between two adjacent first touch control lines 61, as compared to the touch control display panel in which all the first touch control lines 61 are directly electrically connected to the element 90, the touch control display panel in FIG. 9 may effectively reduce the area occupied by the first touch control lines 61 in the non-display region, thereby facilitating the narrow border design of the touch control display panel.

As shown in FIG. 9, for example, when the first touch control lines 612 are directly electrically connected to the element 90 disposed in the first non-display region BB1, i.e., the first touch control lines 611, 612 are all electrically connected to the element 90 disposed in the first non-display region BB1 without adopting the conductive leads 70, only two first touch control lines 61 may be accommodated within the third non-display region BB3. As a comparison, as shown in FIG. 9, through configuring certain first touch control lines 61, such as first touch control lines 612, to be electrically connected to the element 90 through the conductive leads 70 disposed at a different layer from the first touch control lines 61, four first touch control lines 61 (2 first touch control lines 611 and 2 first touch control lines 612) may be accommodated within the third non-display region BB3. In particular, the conductive leads 70 electrically connected to the first touch control lines 61 may be disposed in the same layer as the reflective electrodes of the organic light-emitting unit 22, or disposed in the same layer as any one of the metal layers in the pixel driving circuit 21, or disposed in an extra metal layer introduced to the touch control display panel.

It should be noted that, FIG. 9 shows that, through configuring certain first touch control lines 61 (such as first touch control lines 612) to be electrically connected to the element 90 through the conductive leads 70 disposed at a different layer from the first touch control lines 61, while configuring certain other first touch control lines 61 (such as first touch control lines 611) to be directly electrically connected to the element 90, four first touch control lines 61 (i.e., 2 first touch control lines 611 and 2 first touch control lines 612) may be accommodated within the third non-display region BB3. However, the number of the first touch control lines 61 disposed within the third non-display region BB3 are for illustrative purposes and are not intended to limit the scope of the present disclosure.

In another embodiment, the touch control display panel may include more first touch control lines 61, through configuring certain first touch control lines 61 to be electrically connected to the element 90 through the conductive leads 70 disposed at a different layer from the first touch control lines 61, on one hand, the area occupied by the first touch control lines 61 in the non-display region of the touch control display panel may be significantly reduced, thereby facilitating the narrow border design of the touch control display panel. On the other hand, through configuring certain first touch control lines 61 to be electrically connected to the element 90 through the conductive leads 70 disposed at a different layer from the first touch control lines 61, given the same area of the non-display region, the same line width of the first touch control line 61, and the same number of the first touch control lines 61, the gap between adjacent first touch control line 61 may be increased. Accordingly, the manufacturing process of the touch control display panel may be significantly simplified.

In one embodiment, the plurality of conductive leads 70 may include a plurality of first conductive leads and a plurality of second conductive leads, and the plurality of first conductive leads may be disposed in a layer different from the plurality of second conductive leads. A corresponding structure is shown in FIGS. 10-11.

Figure 10:
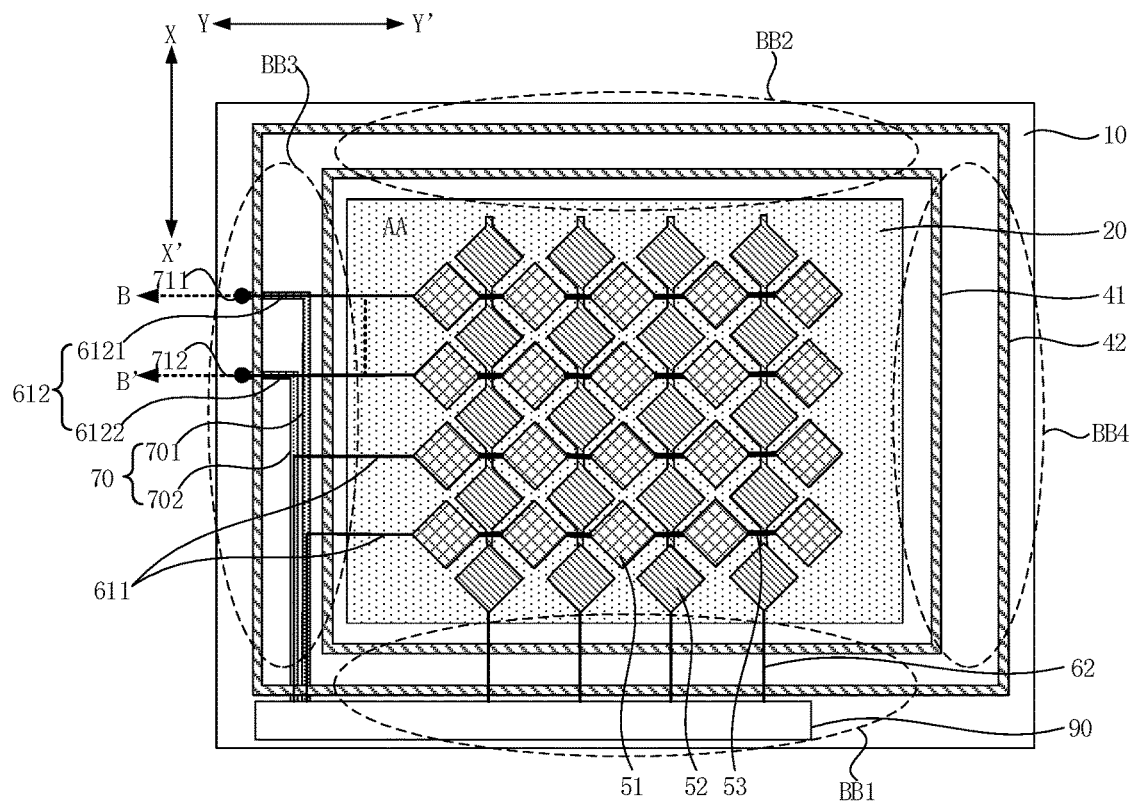
FIG. 10 illustrates a schematic top view of another exemplary touch control display panel consistent with disclosed embodiments.

FIG. 10 illustrates a schematic top view of another exemplary touch control display panel consistent with disclosed embodiments. FIG. 11 illustrates a BB'-sectional view of another exemplary touch control display panel in FIG. 10 consistent with disclosed embodiments.

Figure 11:
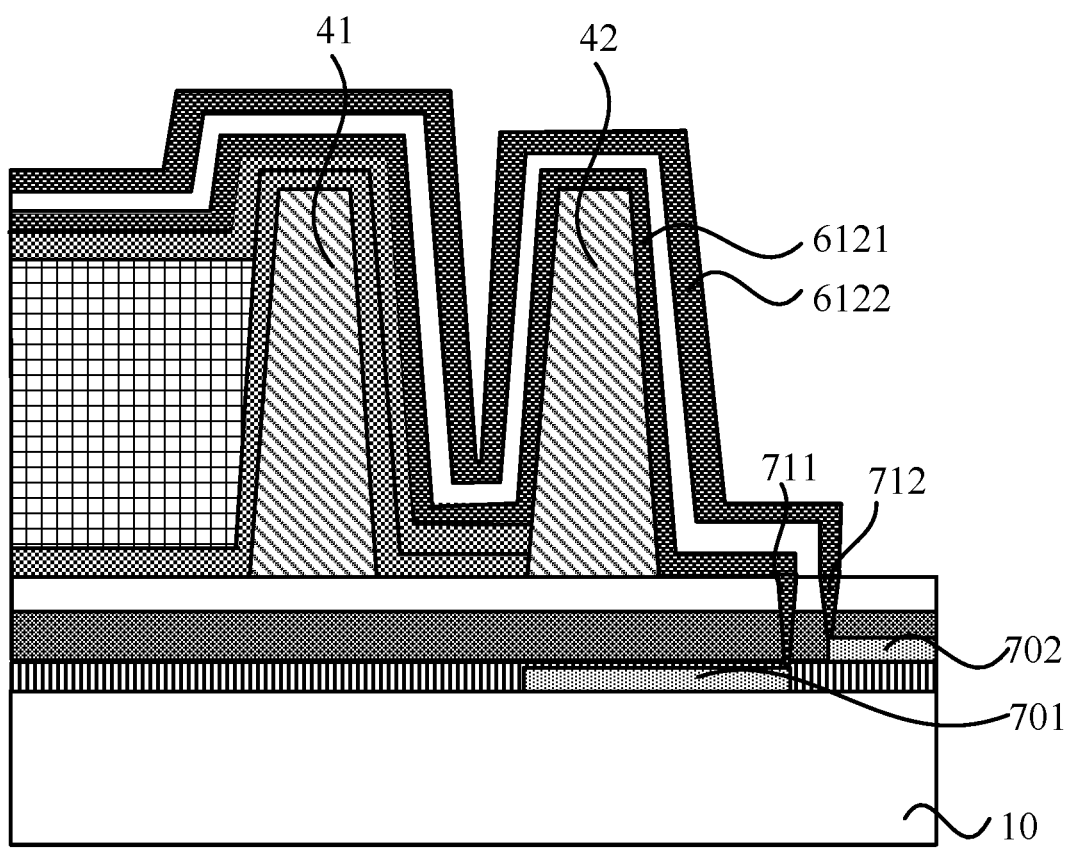
FIG. 11 illustrates a BB'-sectional view of another exemplary touch control display panel in FIG. 10 consistent with disclosed embodiments.

As shown in FIGS. 10-11, a plurality of first touch control lines 612 electrically connected to the conductive leads 70 may comprise a first touch control line 6121 and a first touch control line 6122. A plurality of conductive leads 70 may comprise a first conductive lead 701 and a second conductive lead 702. The first touch control line 6121 may be electrically connected to the first conductive lead 701 through stepping across the second retaining wall 41 and the first retaining wall 42, and the connection region 711 between the first touch control line 6121 and the first conductive lead 701 may be located outside the second retaining wall 42.

As shown in FIG. 11, the first conductive lead 701 and the second conductive lead 702 may be provided at different layers. For example, the conductive leads 701 may be disposed in the same layer as the reflective electrode of the organic light-emitting unit 22 or disposed in the same layer as any one of the metal layers in the pixel driving circuit 21, and the conductive leads 702 may be disposed in the same layer as the reflective electrode of the organic light-emitting unit 22 or disposed in the same layer as any one of the metal layers in the pixel driving circuit 21, as long as the first conductive lead 701 and the second conductive lead 702 are disposed at different layers.

Compared to the touch control display panel in which all the conductive leads 70 electrically connected to the first touch control lines 61 are disposed in the same layer, through configuring the plurality of conductive leads 70 to include a plurality of first conductive leads 701 and a plurality of second conductive leads 702 disposed in a layer different from the plurality of first conductive leads 701, the area occupied by the first touch control lines 61 in the non-display region of the touch control display panel may be further reduced, thereby further facilitating the narrow border design of the touch control display panel.

It should be noted that, the plurality of conductive leads 70 may include but not limited to a plurality of first conductive leads 701 and a plurality of second conductive leads 702 disposed in different layers. In another embodiment, the plurality of conductive leads 70 may include a total number of n conductive leads, where n is a positive integer and larger than 2. The first conductive lead 701, the second conductive lead 702, . . . , and the n-th conductive lead may be disposed in the same layer as the reflective electrode of the organic light-emitting unit 22 or disposed in the same layer as any one of the metal layers in the pixel driving circuit 21, as long as the first conductive lead 701, the second conductive lead 702, . . . , and the n-th conductive lead are disposed at different layers. Accordingly, the area occupied by the first touch control lines 61 in the non-display region of the touch control display panel may be further reduced, thereby further facilitating the narrow border design of the touch control display panel.

Figure 12:
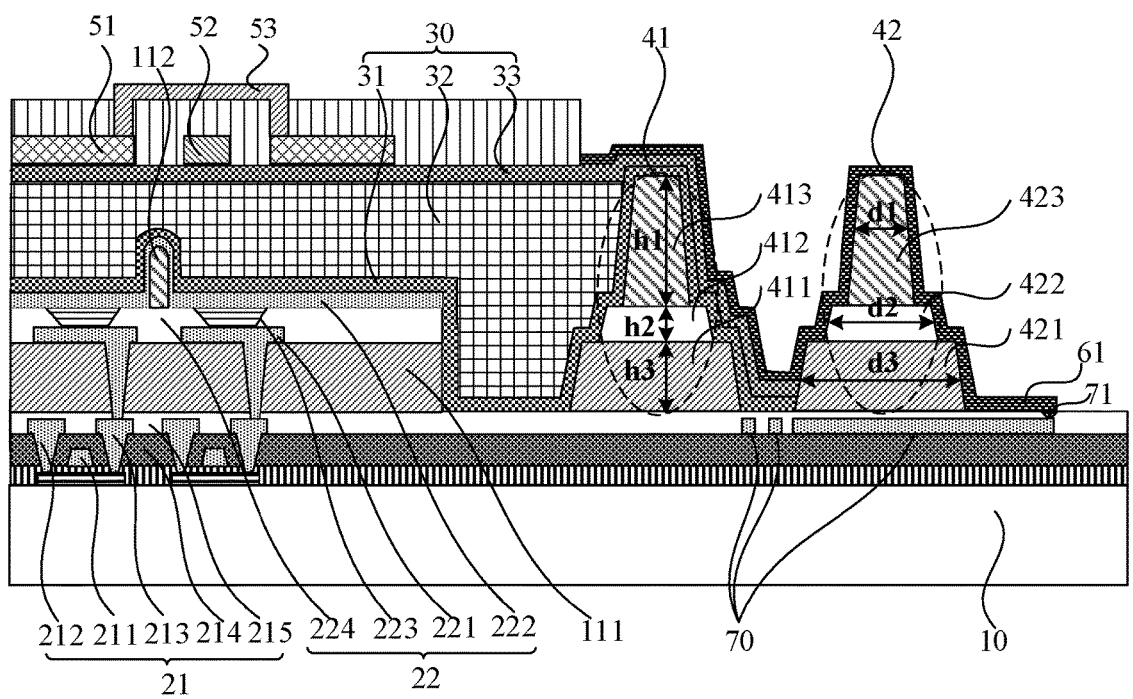
FIG. 12 illustrates a schematic cross-sectional view of another exemplary touch control display panel consistent with disclosed embodiments.

FIG. 12 illustrates a schematic cross-sectional view of another exemplary touch control display panel consistent with disclosed embodiments.

As shown in FIG. 12, the cross-sectional view of each of the second retaining wall 41 and the first retaining wall 42 may have a stepped profile. The second retaining wall 41 and the first retaining wall 42 each may extend in a direction parallel to the surface of the substrate 10. In a direction perpendicular to the extending direction of the second retaining wall 41 or the extending direction of the first retaining wall 42, the width of the cross-section of at least one of the second retaining wall 41 and the first retaining wall 42 may gradually decrease in a direction far away from the substrate 10, i.e. d1<d2<d3.

Because the first touch control line 61 is electrically connected to the corresponding conductive lead 70 through crossing the second retaining wall 41 and the first retaining wall 42, the connection region where the first touch control line 61 is electrically connected to the corresponding conductive lead 70 is located outside the first retaining wall 42, while the retaining wall of a non-stepped shape exhibits a substantially large drop, the first touch control line 61 which is electrically connected to the corresponding conductive lead 70 through crossing the second retaining wall 41 and the first retaining wall 42 may be likely to be disconnected.

Through gradually reducing the width of the cross-section of at least one of the second retaining wall 41 and the first retaining wall 42 in the direction far away from the substrate 10, i.e., through configuring at least one of the second retaining wall 41 and the first retaining wall 42 to have a stepped cross-sectional shape shown in FIG. 12, the drop of the retaining wall may be converted into step difference h1, h2 and h3. Thus, any disconnections in the first touch control line 61 which is electrically connected to the corresponding conductive lead 70 through crossing the second retaining wall 41 and the first retaining wall 42 may be significantly reduced.

In one embodiment, as shown in FIG. 12, in the direction far away from the substrate 10, the second retaining wall 41 may sequentially comprise a first layer 411, a second layer 412, and a third layer 413, while the first retaining wall 42 may sequentially comprise a first layer 421, a second layer 422, and a third layer 423. To simplify the fabrication process of the touch control display panel, the first layers 411 and 421 may be disposed in the same layer as the planarization layer 111, the second retaining layers 412 and 422 may be disposed in the same layer as the pixel defining layer 224, and the third retaining layers 413 and 423 may be disposed in the same layer as the spacer 112.

Figure 13:
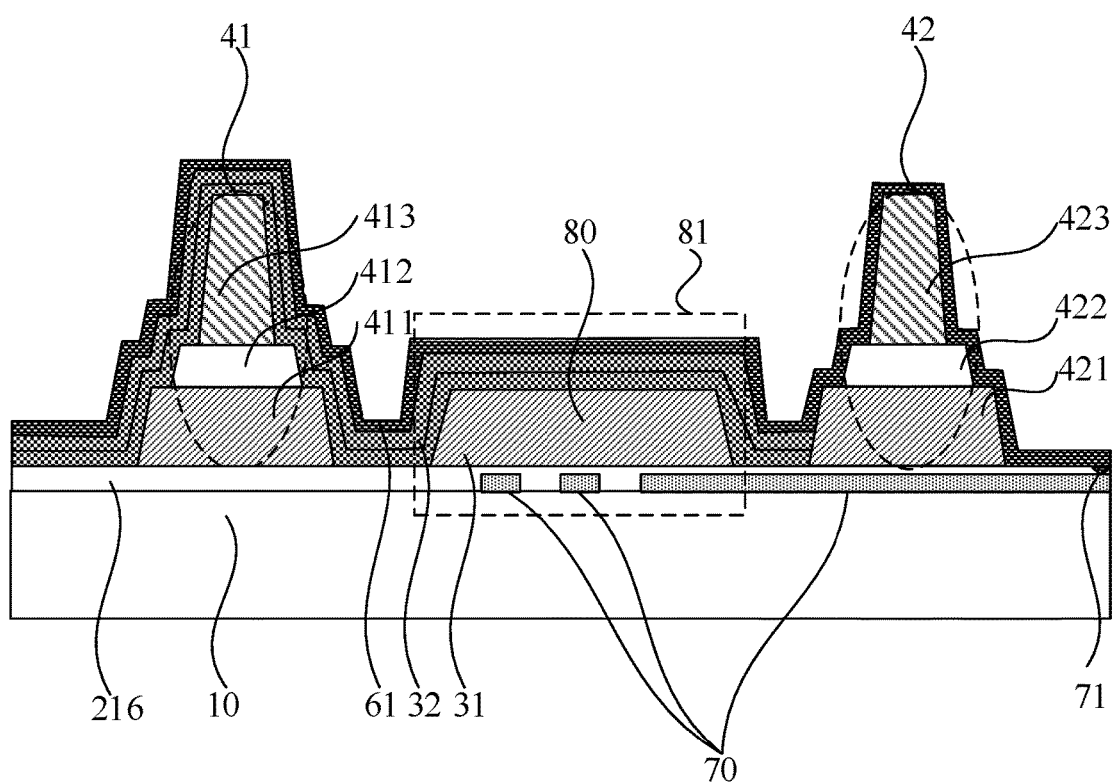
FIG. 13 illustrates a schematic cross-sectional view of another exemplary touch control display panel consistent with disclosed embodiments.

FIG. 13 illustrates a schematic cross-sectional view of another exemplary touch control display panel consistent with disclosed embodiments. The similarities between FIG. 12 and FIG. 13 are not repeated here, while certain difference may be explained.

As shown in FIG. 13, in a direction perpendicular to the substrate 10, the first touch control line 61 which is electrically connected to the conductive lead 70 may overlap with the corresponding conductive lead 70 in a region 81, which is called as an overlapping region 81. An insulating pad 80 may be provided at the overlapping region 81 between the first touch control line 61 (which is electrically connected to the conductive lead 70) and the corresponding conductive lead 70. In the direction perpendicular to the substrate 10, the insulating pad 80 may be disposed between the first touch control line 61 (which is electrically connected to the conductive lead 70) and the corresponding conductive lead 70.

In the direction perpendicular to the substrate 10, the first touch control line 61 which is electrically connected to the conductive lead 70 and the corresponding conductive lead 70 may have the overlapping region 81. Thus, a large coupling effect between the first touch control line 61 and the corresponding conductive lead 70 may be generated in the overlapping region 81, which may affect the signal transmission at the first touch control line 61 and the corresponding conductive lead 70. Through disposing the insulating pad 80 between the first touch control line 61 (which is electrically connected to the conductive lead 70) and the corresponding conductive lead 70, the coupling effect between the first touch control line 61 and the corresponding conductive lead 70 may be suppressed in the overlapping region 81.

The touch control display panel may further include a planarization layer 111 disposed between the pixel driving circuits 21 and the organic light-emitting units 22, a pixel defining layer 224 disposed between any adjacent organic light-emitting units 22, and a spacer 112 disposed on the pixel defining layer 224. To simplify the fabrication process of the touch control display panel, the first layers 411 and 421 may be disposed in the same layer as the planarization layer 111, the second retaining layers 412 and 422 may be disposed in the same layer as the pixel defining layer 224, the third retaining layers 413 and 423 may be disposed in the same layer as the spacer 112, and the insulating pad 80 may be disposed in the same layer as the planarization layer 111, or the pixel defining layer 224, or the spacer 112.

In one embodiment, as shown in FIG. 13, the insulating pad 80 may be disposed in the same layer as the first layers 411 and 421, i.e., the same layer as the planarization layer 111.

In another embodiment, as shown in FIG. 4 and FIG. 5, the conductive lead 70, which is electrically connected to the first touch control line, may be disposed in the same layer as any one of the metal layers in the pixel driving circuit 21. Accordingly, the planarization layer 111 (disposed between the pixel driving circuit 21 and the organic light-emitting unit 22), the pixel defining layer 224 (disposed between any adjacent organic light-emitting units 22), as well as, the spacer 112 (disposed on the pixel defining layer 224) may be arranged between the first touch control line 61 (which is electrically connected to the conductive lead 70) and the corresponding conductive lead 70.

In the direction perpendicular to the substrate 10, the first touch control line 61 which is electrically connected to the conductive lead 70 may overlap with the corresponding conductive lead 70 in the overlapping region 81. To reduce the coupling effect between the first touch control line 61 and the corresponding conductive lead 70 in the overlapping region 81, the insulating pad 80 may be fabricated in the overlapping region 81 by using the planarization layer 111, or the pixel defining layer 224, or the spacer 112. That is, the insulating pad 80 may be disposed in the same layer and made from the same material as the planarization layer 111, or the pixel defining layer 224, or the spacer 112.

In another embodiment, as shown in FIG. 6, the conductive lead 70, which is electrically connected to the first touch control line, may be disposed in the same layer as the reflective electrode 221 of the organic light-emitting unit 22. Accordingly, the pixel defining layer 224 (disposed between adjacent organic light-emitting units 22), as well as, the spacer 112 (disposed on the pixel defining layer 224) may be arranged between the first touch control line 61 (which is electrically connected to the conductive lead 70) and the corresponding conductive lead 70.

In the direction perpendicular to the substrate 10, the first touch control line 61 which is electrically connected to the conductive lead 70 may overlap with the corresponding conductive lead 70 in the overlapping region 81. To reduce the coupling effect between the first touch control line 61 and the corresponding conductive lead 70 in the overlapping region 81, the insulating pad 80 may be fabricated in the overlapping region 81 by using the pixel defining layer 224, or the spacer 112. That is, the insulating pad 80 may be disposed in the same layer and made from the same material as the pixel defining layer 224, or the spacer 112.

In one embodiment, as shown in FIG. 13, a gap may be configured between the insulating pad 80 and the second retaining wall 41 and, meanwhile, a gap may be configured between the insulating pad 80 and the first retaining wall 42. When the insulating pad 80 is disposed immediately adjacent to the second retaining wall 41 and the first retaining wall 42, once the moisture and oxygen in the external environment penetrate the defects in the thin film encapsulating layer 30, the moisture and oxygen may continue penetrating the first retaining wall 42, the thin film encapsulating layer 30, and the second retaining wall 41, and finally enter the display region AA of the touch display panel. Thus, the risk for the moisture and oxygen in the external environment to penetrate the first retaining wall 42, the thin film encapsulating layer 30 and the second retaining wall 41 may be greatly increased.

Through configuring a gap between the insulating pad 80 and the second retaining wall 41 and a gap between the insulating pad 80 and the first retaining wall 42, the risk for the moisture and oxygen in the external environment to enter the display region AA through penetrating the first retaining wall 42, the thin film encapsulating layer 30 and the second retaining wall 41 may be greatly reduced. Accordingly, the various components in the display region AA may be prevented from being affected by the moisture and oxygen in the external environment.

Figure 14:
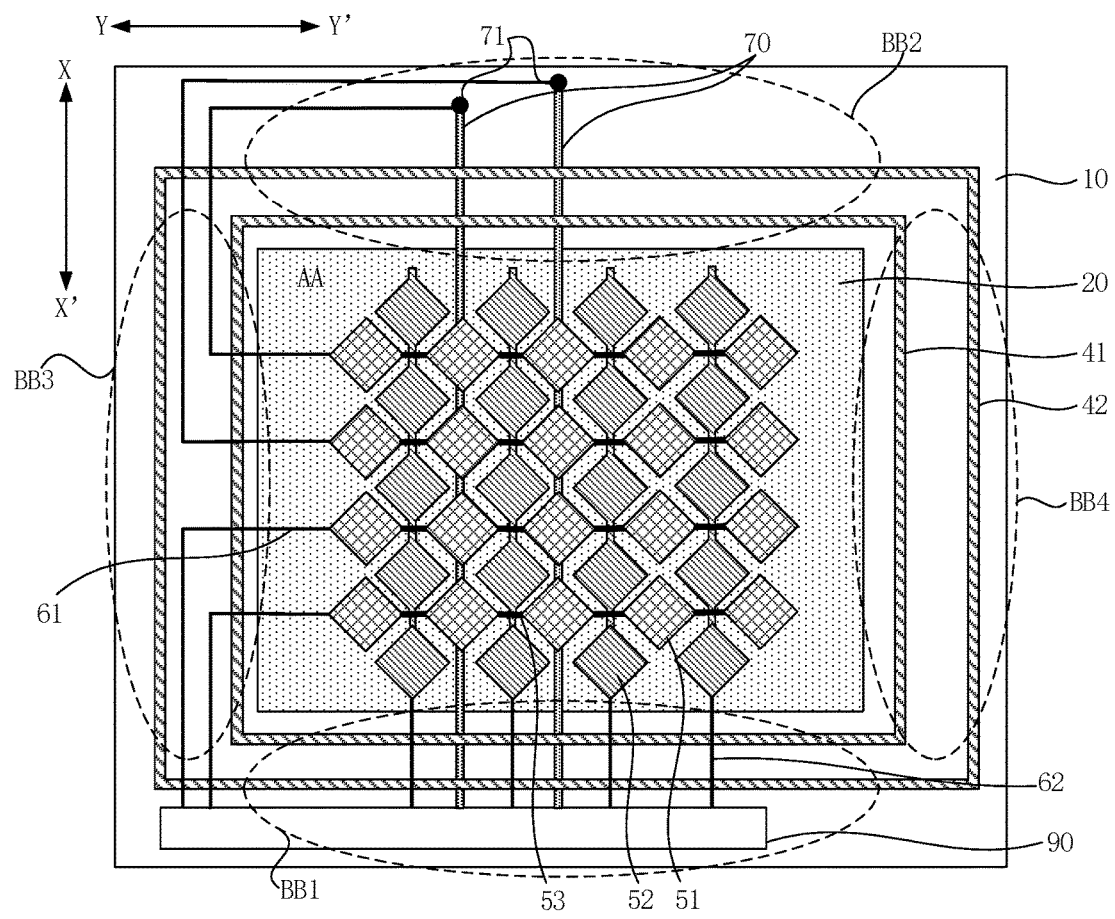
FIG. 14 illustrates a schematic top view of another exemplary touch control display panel consistent with disclosed embodiments.

FIG. 14 illustrates a schematic top view of another exemplary touch control display panel consistent with disclosed embodiments.

As shown in FIG. 14, a plurality of conductive leads 70 may be disposed in the display region AA and extend to the non-display region of the touch control display panel. The connection region 71 where the first touch control line 61 is electrically connected to the corresponding conductive lead 70 may be arranged in the second non-display region BB2. The first touch control lines 61 electrically connected to the corresponding conductive leads 70, and the first touch control lines 61 not electrically connected to the conductive leads 70 may extend in two opposite directions of the first direction XX'. That is, as shown in FIG. 14, the first touch control lines 61 electrically connected to the corresponding conductive leads 70 may extend in the X'X direction, while the first touch control lines 61 not electrically connected to the corresponding conductive leads 70 may extend in the XX' direction.

Compared to the touch control display panel in which the first touch control lines 61 electrically connected to the corresponding conductive leads 70 extend in the same direction as the first touch control lines 61 not electrically connected to the conductive leads 70, through configuring the first touch control lines 61 electrically connected to the corresponding conductive leads 70 to extend in a different direction from the first touch control lines 61 not electrically connected to the conductive leads 70, the area occupied by the touch control lines 61 in the non-display region of the touch control display may be reduced. Accordingly, the narrow borders of the touch control display panel may be realized.

Meanwhile, through configuring the connection region 71 where the first touch control line 61 is electrically connected to the corresponding conductive lead 70 to be outside the first retaining wall 42, any holes for realizing the electrical connection between the first touch control line 61 and the corresponding conductive lead 70 may not have to be disposed in the thin film encapsulation layer 30. Accordingly, the oxygen and moisture barrier properties of the thin film encapsulation layer 30 may be prevented from being degraded by the holes in the thin film encapsulation layer 30.

In one embodiment, the touch control display panel may include n rows of the first touch control electrodes 51 (i.e., n first touch control electrode rows). The first touch control electrode row disposed furthest away from the element 90 is defined as the $1^{st}$ first touch control electrode row, and the remaining first touch control electrode rows are sequentially sorted. The first touch control lines 61, which are corresponding to the $1^{st}$ to the m-th first touch control electrode rows, may be electrically connected to the corresponding conductive leads 70, and further electrically connected to the driving chip or FPC in the first non-display region BB1 through the corresponding conductive leads 70. The first touch control lines 61, which are corresponding to the (m+1)-th to the n-th first touch control electrode rows, may be directly electrically connected to the driving chip or FPC in the first non-display region BB1, where m and n are both positive integers, and m is smaller than n.

In another embodiment, the first touch control lines 61, which are corresponding to the $1^{st}$ first touch control electrode row to the m-th first touch control electrode row, may be directly electrically connected to the driving chip or FPC in the second non-display region BB2. The first touch control lines 61, which are corresponding to the (m+1)-th first touch control electrode row to the n-th first touch control electrode row, may be electrically connected to the corresponding conductive leads 70, and further electrically connected to the driving chip or FPC in the second non-display region BB2 through the corresponding conductive leads 70.

When the first touch control lines 61 electrically connected to the corresponding conductive leads 70 intersect or cross the first touch control lines 61 not electrically connected to the conductive leads 70, a coupling effect may be generated between the first touch control lines 61, affecting the signal transmission at the first touch control lines 61.

To prevent the first touch control lines 61 electrically connected to the corresponding conductive leads 70 from intersecting the first touch control lines 61 not electrically connected to the conductive leads 70, in one embodiment, as shown in FIG. 14, on one hand, the first touch control lines 61, which are corresponding to two first touch control electrode rows located in the upper half, may be electrically connected to the corresponding conductive leads 70, and further electrically connected to the driving chip or FPC in the first non-display region BB1 through the corresponding conductive leads 70. On the other hand, the first touch control lines 61, which are corresponding to two first touch control electrode rows located in the lower half, may be directly electrically connected to the driving chip or FPC in the first non-display region BB1.

In another embodiment, the first touch control lines 61, which are corresponding to two first touch control electrode rows located in the upper half, may be directly electrically connected to the driving chip or FPC in the first non-display region BB1. The first touch control lines 61, which are corresponding to two first touch control electrode rows located in the lower half, may be electrically connected to the corresponding conductive leads 70, and further electrically connected to the driving chip or FPC in the second non-display region BB2 through the corresponding conductive leads 70.

It should be noted that, in FIG. 14, the selection and the number of the first touch control electrode rows corresponding to which the first touch control lines 61 are directly electrically connected to the driving chip or FPC in the non-display region, and the selection and the number of the first touch control electrode rows corresponding to which the first touch control lines 61 are electrically connected to the driving chip or FPC in the non-display region through the corresponding conductive leads 70, are for illustrative purposes and are not intended to limit the scope of the present disclosure.

Further, the first touch control electrode rows corresponding to which the first touch control lines 61 may be directly electrically connected to the driving chip or FPC in the non-display region, and the first touch control electrode rows corresponding to which the first touch control lines 61 may be electrically connected to the driving chip or FPC in the non-display region through the corresponding conductive leads 70, may be determined according to various application scenarios, which is not limited by the present disclosure, as long as the first touch control lines 61 electrically connected to the corresponding conductive leads 70 are prevented from intersecting the first touch control lines 61 not electrically connected to the conductive leads 70.

Further, the organic light-emitting structure 20 may include a plurality of pixel driving circuits 21 and a plurality of organic light-emitting units 22 electrically connected to the pixel driving circuits 21, and the conductive lead 70 may be disposed in the same layer as the reflective electrode of the organic light-emitting unit 22 or in the same layer as any one of the metal layers in the pixel driving circuit 21. When the conductive lead 70 is disposed in the same layer as the reflective electrode of the organic light-emitting unit 22 or in the same layer as any one of the metal layers in the pixel driving circuit 21, the first touch control line 61 may be electrically connected to the conductive lead 70 via a through-hole disposed in the layers sandwiched between the first touch control line 61 electrically connected to the conductive lead 70 and the corresponding conductive lead 70.

Through disposing the first touch control line 61 electrically connected to the conductive lead 70 in a different layer from the corresponding conductive lead 70, the first touch control line 61 may have more freedom to be electrically connected to the element 90 (such as the driving chip, FPC) in the non-display region. Further, through configuring the first touch control lines 61 electrically connected to the corresponding conductive leads 70 and the first touch control lines 61 not electrically connected to the conductive leads 70 to extend in two opposite directions of the first direction XX', the area occupied by the touch control lines 61 in the non-display region of the touch control display may be reduced, thereby facilitating the narrow borders of the touch control display panel.

In one embodiment, the first touch control electrode 51 may be configured as a touch driving electrode, the second touch control electrode 52 configured as a touch sensing electrode. In another embodiment, the first touch control electrode 51 may be configured as a touch sensing electrode, the second touch control electrode 52 configured as a touch driving electrode. A capacitance may be formed between the first touch control electrode 51 and the second touch control electrode 52. The first touch control electrode 51 and the second touch control electrode 52 may be disposed in the same layer or different layers. When the first touch control electrodes 51 are disposed in the same layer as the second touch control electrodes 52, the first touch control electrodes 51 may be electrically connected to each other through a bridge 53.

It should be noted that, the first direction XX' and the second direction YY' in FIG. 14 are for illustrative purposes, and are not intended to limit the scope of the present disclosure. In practical applications, the first direction XX' and the second direction YY' may be determined according to various application scenarios, as long as the first direction XX' and the second direction YY' are intersected and arranged in the plane parallel to the substrate 10.

In addition, the size of each element and the thickness of each layer shown in the accompanying drawings are for illustrative purposes, and are not intended to represent the actual dimensions of the elements and the actual thickness of each layer in the display panel.

In the disclosed embodiments, the organic light-emitting structure 20 may be disposed on the display region of the substrate 10, and the thin film encapsulation layer 30 may cover the organic light-emitting structure 20. The first retaining wall 42 may be disposed on the non-display region of the substrate 10 and surrounding the organic light-emitting structure 20.

The plurality of first touch control electrodes 51 may be intersecting but electrically insulated from the plurality of second touch electrodes 52. The plurality of first touch control electrodes 51 may extend in a different direction from the plurality of second touch electrodes 52. Each first touch control electrode 51 may be electrically connected to a corresponding first touch control line 61, and each second touch control electrode 52 may be electrically connected to a corresponding second touch control line 62.

The thin film encapsulation layer 30 may have a first side facing the substrate 10 and an opposite second side. In particular, through disposing a plurality of conductive leads 70 on the first side of the thin film encapsulation layer 30, at least one first touch control line 61 may step across the first retaining wall 42 to be electrically connected to the corresponding conductive lead 70, and further electrically connected to the element 90 (such as a driving chip or a FPC) disposed in the first non-display region BB1 through the corresponding conductive lead 70.

That is, the first touch control lines 61, which are previously directly electrically connected to the element 90 (such as a driving chip or a FPC) disposed in the first non-display region BB1, now may be electrically connected to the element 90 (such as a driving chip or a FPC) disposed in the first non-display region BB1 through the corresponding conductive leads 70. Through configuring the positions of the conductive lead 70 through which the first touch control line 61 is electrically connected to the element 90 (such as a driving chip or a FPC) in the first non-display region BB1, the area occupied by the touch control lines 61 in the non-display region of the touch control display may be reduced, thereby facilitating the narrow borders of the touch control display panel.

Meanwhile, when the first touch control line 61 is electrically connected to the corresponding conductive lead 70 via a through-hole, because the retaining wall effectively confines the edge of the thin film encapsulation layer 30, through configuring the connection region 71 where the first touch control line 61 is electrically connected to the corresponding conductive lead 70 to be outside the first retaining wall 42, the connection region 71 where the first touch control line 61 is electrically connected to the corresponding conductive lead 70 may be no longer in the thin film encapsulation layer 30.

That is, a through-hole may not have to be disposed in the thin film encapsulation layer 30 for realizing the electrical connection between the first touch control line 61 and the corresponding conductive lead 70. Accordingly, the oxygen and moisture barrier properties of the thin film encapsulation layer 30 may not be degraded by the holes in the thin film encapsulation layer 30, and the various elements inside the touch control panel display may not be affected by the oxygen and moisture from the external environment.

Figure 15:
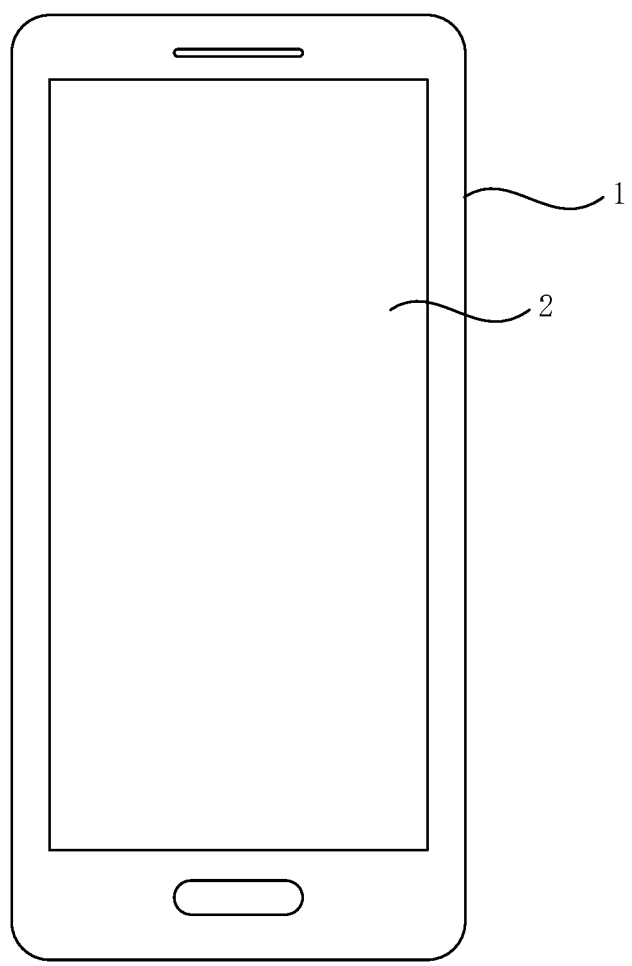
FIG. 15 illustrates an exemplary touch control display device consistent with disclosed embodiments.

The present disclosure also provides a touch control display device comprising any one of the disclosed touch control display panels. FIG. 15 illustrates an exemplary touch control display device consistent with disclosed embodiments.

As shown in FIG. 15, the touch control display device 1 may comprise a touch control display panel 2, which may be any one of the disclosed touch control display panels. Because the touch control display device 1 comprises any one of the disclosed touch control display panels, the touch control display device 1 may also have the same advantages as the disclosed touch control display panels, which are not repeated here. The touch control display device 1 may be a smart phone, a tablet, and a wearable touch control display device, etc., which is not limited by the present disclosure.

It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A touch control display panel, comprising:
   a substrate including a display region and a non-display region surrounding the display region, wherein the non-display region includes a first non-display region, a second non-display region arranged opposite to the first non-display region in a first direction, a third non-display region, and a fourth non-display region arranged opposite to the third non-display region in a second direction;
   an organic light-emitting structure disposed on the display region of the substrate;

a thin film encapsulation layer having a first side facing the substrate and an opposite second side;

a first retaining wall disposed on the non-display region of the substrate and surrounding the organic light-emitting structure;

a plurality of first touch control electrodes extending in the second direction and a plurality of second touch control electrodes extending in the first direction;

a plurality of first touch control lines and a plurality of second touch control lines disposed in the non-display region of the touch control display panel; and a plurality of conductive leads disposed on the first side of the thin film encapsulation layer, wherein at least one first touch control line steps across the first retaining wall to be electrically connected to a corresponding conductive lead, and further electrically connected to a driving chip or a flexible printed circuit (FPC) disposed in the first non-display region through the corresponding conductive lead, and a connection region where the at least one first touch control line is electrically connected to the corresponding conductive lead is arranged outside the first retaining wall.

2. The touch control display panel according to claim 1, wherein:

the thin film encapsulation layer is configured to cover the organic light-emitting structure;

the plurality of first touch control electrodes are intersecting but electrically insulated from the plurality of second touch control electrodes; and each first touch control electrode is electrically connected to a corresponding first touch control line, and each second touch control electrode is electrically connected to a corresponding second touch control line.

3. The touch control display panel according to claim 2, further including:

a second retaining wall disposed on the non-display region of the substrate and surrounding the organic light-emitting structure, wherein the first retaining wall is disposed surrounding the second retaining wall.

4. The touch control display panel according to claim 1, wherein:

the organic light-emitting structure comprises a plurality of pixel driving circuits and a plurality of organic light-emitting units electrically connected to the plurality of pixel driving circuits; and the plurality of conductive leads are disposed in a same layer as any one of metal layers in a pixel driving circuit or disposed in a same layer as a reflective electrode of an organic light-emitting unit.

5. The touch control display panel according to claim 2, wherein:

the plurality of conductive leads are in direct contact with the substrate.

6. The touch control display panel according to claim 3, wherein:

each of the second retaining wall and the first retaining wall has a stepped cross-section;

each of the second retaining wall and the first retaining wall extends in a direction parallel to the substrate; and in a direction perpendicular to an extending direction of the second retaining wall or an extending direction of the first retaining wall, a width of the cross-section of at least one of the second retaining wall and the first retaining wall gradually decreases in a direction far away from the substrate.

7. The touch control display panel according to claim 4, further including:

a planarization layer disposed between the pixel driving circuit and the organic light-emitting unit;

a pixel defining layer disposed between adjacent organic light-emitting units; and a spacer disposed on the pixel defining layer, wherein:

in a direction far away from the substrate, the second retaining wall sequentially comprises a first layer, a second layer, and a third layer;

the first retaining wall sequentially comprises a first layer, a second layer, and a third layer, the first layer of the second retaining wall and the first layer of the first retaining wall are disposed in a same layer as the planarization layer, the second retaining layer of the second retaining wall and the first layer of the first retaining wall are disposed in a same layer as the pixel defining layer, and the third retaining layer of the second retaining wall and the first layer of the first retaining wall are disposed in a same layer as the spacer.

8. The touch control display panel according to claim 3, wherein:

the plurality of conductive leads are disposed between the second retaining wall and the first retaining wall; and the connection region where the at least one first touch control line is electrically connected to the corresponding conductive lead is arranged in at least one of the third non-display region and the fourth non-display region.

9. The touch control display panel according to claim 2, wherein:

the plurality of conductive leads includes a plurality of first conductive leads and a plurality of second conductive leads; and the plurality of first conductive leads are disposed in a layer different from the plurality of second conductive leads.

10. The touch control display panel according to claim 8, wherein:

an insulating pad is disposed at an overlapping region between the at least one first touch control line and the corresponding conductive lead; and in a direction perpendicular to the substrate, the insulating pad is disposed between the at least one first touch control line and the corresponding conductive lead.

11. The touch control display panel according to claim 10, further including:

a planarization layer disposed between the pixel driving circuit and the organic light-emitting unit;

a pixel defining layer disposed between adjacent organic light-emitting units; and a spacer disposed on the pixel defining layer, wherein the insulating pad is disposed in a same layer as the planarization layer, the pixel defining layer, or the spacer.

12. The touch control display panel according to claim 10, wherein:

a gap is configured between the insulating pad and the second retaining wall; and a gap is configured between the insulating pad and the first retaining wall.

13. The touch control display panel according to claim 2, wherein:

the plurality of conductive leads are disposed in the display region and extending to the non-display region of the touch control display panel the connection region where the at least one first touch control line is electrically connected to the corresponding conductive lead is arranged in the second non-display region; and the at least one first touch control line electrically connected to the corresponding conductive lead, and a first touch control lines not electrically connected to a conductive lead are extending in two opposite directions of the first direction.

14. The touch control display panel according to claim 13, wherein:

the plurality of first touch control electrodes are arranged into n number of first touch control electrode rows;

the first touch control lines, which are corresponding to the $1^{st}$ to the m-th first touch control electrode rows, are electrically connected to the corresponding conductive leads, and further electrically connected to the driving chip or FPC in the first non-display region through the corresponding conductive leads; and the first touch control lines, which are corresponding to the (m+1)-th to the n-th first touch control electrode rows, are directly electrically connected to the driving chip or FPC in the first non-display region, where m and n are both positive integers, and m is smaller than n.

15. The touch control display panel according to claim 3, wherein:

the thin film encapsulating layer comprise at least one inorganic barrier layer and at least one organic barrier layer alternately arranged;

the second retaining wall is at least covered by an outermost inorganic barrier layer in the thin film encapsulating layer;

the second retaining wall is not covered by the at least one organic barrier layer; and the first retaining wall is covered or not covered by the at least one inorganic barrier layer.

16. The touch control display panel according to claim 2, wherein:

the plurality of first touch control electrodes and the plurality of second touch control electrodes are disposed inside the thin film encapsulation layer, or disposed on the second side of the thin film encapsulation layer.

17. A touch control display device, comprising:
a touch control display panel, comprising:
a substrate including a display region and a non-display region surrounding the display region, wherein the non-display region includes a first non-display region, a second non-display region arranged opposite to the first non-display region in a first direction, a third non-display region, and a fourth non-display region arranged opposite to the third non-display region in a second direction;

an organic light-emitting structure disposed on the display region of the substrate;

a thin film encapsulation layer having a first side facing the substrate and an opposite second side;

a first retaining wall disposed on the non-display region of the substrate and surrounding the organic light-emitting structure;

a plurality of first touch control electrodes extending in the second direction and a plurality of second touch control electrodes extending in the first direction;

a plurality of first touch control lines and a plurality of second touch control lines disposed in the non-display region of the touch control display panel; and a plurality of conductive leads disposed on the first side of the thin film encapsulation layer, wherein at least one first touch control line steps across the first retaining wall to be electrically connected to a corresponding conductive lead, and further electrically connected to a driving chip or a flexible printed circuit (FPC) disposed in the first non-display region through the corresponding conductive lead, and a connection region where the at least one first touch control line is electrically connected to the corresponding conductive lead is arranged outside the first retaining wall.

18. The touch control display device according to claim 17, wherein:

the thin film encapsulation layer is configured to cover the organic light-emitting structure;

the plurality of first touch control electrodes are intersecting but electrically insulated from the plurality of second touch control electrodes; and each first touch control electrode is electrically connected to a corresponding first touch control line, and each second touch control electrode is electrically connected to a corresponding second touch control line.

19. The touch control display device according to claim 18, further including:

a second retaining wall disposed on the non-display region of the substrate and surrounding the organic light-emitting structure, wherein the first retaining wall is disposed surrounding the second retaining wall.

20. The touch control display device according to claim 18, wherein:

the organic light-emitting structure comprises a plurality of pixel driving circuits and a plurality of organic light-emitting units electrically connected to the plurality of pixel driving circuits; and the plurality of conductive leads are disposed in a same layer as any one of metal layers in a pixel driving circuit or disposed in a same layer as a reflective electrode of an organic light-emitting unit.

* * * * *